(12) United States Patent
Kuwahara et al.

(10) Patent No.: US 7,074,694 B2
(45) Date of Patent: Jul. 11, 2006

(54) DEPOSITION MASK, MANUFACTURING METHOD THEREOF, DISPLAY UNIT, MANUFACTURING METHOD THEREOF, AND ELECTRONIC APPARATUS INCLUDING DISPLAY UNIT

(75) Inventors: Takayuki Kuwahara, Suwa (JP); Shinichi Yotsuya, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/854,779

(22) Filed: May 26, 2004

(65) Prior Publication Data
US 2005/0019968 A1   Jan. 27, 2005

(30) Foreign Application Priority Data
Jul. 22, 2003   (JP) ............................... 2003-200064

(51) Int. Cl.
*H01L 21/30* (2006.01)
*H01L 21/46* (2006.01)
(52) U.S. Cl. ........................................ 438/455; 438/464
(58) Field of Classification Search ................ 438/455, 438/460, 462, 464, 800
See application file for complete search history.

(56) References Cited

U.S. PATENT DOCUMENTS

| | | | |
|---|---|---|---|
| 5,199,055 A | | 3/1993 | Noguchi et al. |
| 5,783,309 A | | 7/1998 | Faure et al. |
| 6,022,462 A | | 2/2000 | Ikeda et al. |
| 6,459,712 B1 | * | 10/2002 | Tanaka et al. ................ 372/45 |
| 6,603,159 B1 | * | 8/2003 | Atobe et al. ................ 257/280 |
| 6,804,323 B1 | * | 10/2004 | Moriya et al. ................ 378/35 |
| 6,897,126 B1 | * | 5/2005 | Asano et al. ................ 438/460 |
| 2002/0059903 A1 | | 5/2002 | Hasegawa et al. |
| 2002/0111035 A1 | | 8/2002 | Atobe et al. |
| 2003/0059690 A1 | | 3/2003 | Yotsuya |
| 2003/0061593 A1 | | 3/2003 | Yotsuya |
| 2003/0151118 A1 | | 8/2003 | Baude et al. |

FOREIGN PATENT DOCUMENTS

| | | |
|---|---|---|
| JP | 10 207044 | 8/1998 |
| JP | 2001-185350 | 7/2001 |
| JP | 2003-100460 | 4/2003 |
| WO | WO 03/069014 | 8/2003 |

OTHER PUBLICATIONS

Communication from European Patent Office re: counterpart application.

* cited by examiner

*Primary Examiner*—Phuc T. Dang
(74) *Attorney, Agent, or Firm*—Harness, Dickey & Pierce, P.L.C.

(57) ABSTRACT

To provide a high-precision deposition mask capable of vapor deposition on a large-sized deposition substrate in a vacuum deposition process, a method for readily manufacturing the deposition mask at low cost, an electroluminescent display unit, a method for manufacturing the unit, and an electronic apparatus including the electroluminescent display unit. A deposition mask has a configuration in which one or more mask chips each including a single crystal silicon substrate are joined to a mask support. The one or more mask chips are joined to respective predetermined sections of the mask support, the orientations of the one or more mask chips are arranged in such a manner that the crystal orientation of the single crystal silicon substrate is aligned in a predetermined direction, and the single crystal silicon substrate of each mask chip has openings.

14 Claims, 8 Drawing Sheets

DEPOSITION MASK, MANUFACTURING METHOD THEREOF, DISPLAY UNIT, MANUFACTURING METHOD THEREOF, AND ELECTRONIC APPARATUS INCLUDING DISPLAY UNIT

BACKGROUND OF THE INVENTION

1. Field of the Invention

The present invention relates to deposition masks used for forming hole-transport layers, light-emitting layers and the like for devices such as electroluminescent display units, methods for manufacturing such masks, electroluminescent display units, methods for manufacturing such units, and electronic apparatuses including the electroluminescent display units. The present invention particularly relates to a deposition mask principally used to manufacture an organic electroluminescent display unit (hereinafter referred to as an organic EL display unit) and the like.

2. Description of the Related Arts

Known organic EL display units are usually manufactured by vacuum deposition of organic compounds using a vacuum deposition apparatus in a resistance-heating evaporation system. In particular, for full-color organic EL display units, fine light emitting elements for emitting RGB (red, green, and blue) light must be precisely fabricated. Therefore, such units are manufactured by a mask evaporation process in which organic compounds that are different from each other depending on RGB pixels are selectively deposited on desired regions using metal masks and the like. In order to manufacture full-color organic EL display units with high definition, fine deposition masks must be used. Since such deposition masks must be thin and fine, the masks are conventionally prepared by an electroforming process.

As the definition of the organic EL display units has been enhanced, misalignment due to heat has become serious because known metal masks have a thermal expansion coefficient that is greatly different from that of a deposition substrate treated by a vapor deposition process, made of glass or the like. Especially in the case of using a large-sized deposition substrate treated by a vapor deposition process in order to increase the number of elements obtained from the deposition substrate, the misalignment due to heat is outstandingly caused.

In order to solve that problem, a deposition mask is prepared using a silicon wafer having a thermal expansion coefficient smaller than that of glass.

In order to manufacture a plurality of organic EL display units from a single large-sized deposition substrate, there is a known deposition mask having a configuration that a plurality of second substrates (mask chips), each of which is used for manufacturing one organic EL display unit and formed of a silicon substrate, are joined to a first substrate (a mask support) made of borosilicate glass having apertures. The reason to employ such a configuration is as follows: since an available silicon wafer is disk-shaped having a diameter of about 300 mm at the most, a deposition mask fit for a large-sized deposition substrate cannot be manufactured using such an wafer. Since the first substrate is made of borosilicate glass having a thermal expansion coefficient close to that of silicon, the flexure of the deposition mask is reduced.

In the known deposition mask, when the second substrates consisting of silicon substrates are joined to the first substrate made of borosilicate glass, each of the second substrates must be aligned with the first substrate one by one after one second substrate is joined to the first substrate, and high processing accuracy is necessary; hence, there is a problem in that an increase in the time taken for the process causes an increase in cost.

Since the second substrates have openings according to a pixel pattern, there is a problem in that incorrect pixel pattern is formed if the second substrates are misaligned with the first substrate when they are joined to each other.

SUMMARY OF THE INVENTION

It is an object of the present invention to provide a high-precision deposition mask useful in treating a large-sized deposition substrate by a vacuum deposition process and a method for readily manufacturing the deposition mask at low cost. Furthermore, it is an object of the present invention to provide an electroluminescent display unit having an electroluminescent layer including a hole-transport layer formed by using the deposition mask, a method for manufacturing the unit, and an electronic apparatus including the electroluminescent display unit.

A deposition mask according to the present invention has a configuration in which one or more mask chips each including a single crystal silicon substrate are joined to a mask support, wherein the one or more mask chips are joined to respective predetermined sections of the mask support, the orientations of the one or more mask chips are arranged in such a manner that the crystal orientation of the single crystal silicon substrate is aligned in a predetermined direction, and the single crystal silicon substrate of each mask chip has openings.

Since the single crystal silicon substrates of the mask chips are joined to the mask support made of borosilicate glass and the openings according to a pixel pattern are then formed in the resulting single crystal silicon substrates, the positional accuracy need not be high when each of the single crystal silicon substrates is joined to the mask support; hence, the deposition mask can be easily manufactured. Furthermore, since the openings are formed after the single crystal silicon substrates are joined to the mask support, the openings are fit for a fine pixel pattern. If a plurality of the single crystal silicon substrates are joined to the mask support, a large-sized deposition substrate can be treated by a vapor deposition process; hence, a large number of electroluminescent display units can be manufactured at a time.

In the deposition mask of the present invention, an etching mask is formed on each single crystal silicon substrate before the substrates of the mask chips are joined to the respective predetermined sections of the mask support in such a manner that the crystal orientation of the single crystal silicon substrate is aligned in the predetermined direction.

Since the etching mask is formed on the single crystal silicon substrate before the substrates of one or more mask chips are joined to the respective predetermined sections of the mask support, flexure due to heat oxidation or the like can be prevented from occurring in the mask support made of borosilicate glass or the like.

In the deposition mask of the present invention, the mask support is made of the borosilicate glass and the single crystal silicon substrates are joined to the mask support by anodic coupling.

Since the single crystal silicon substrates are joined to the mask support made of borosilicate glass by anodic coupling, an adhesive is not necessary and flexure due to such an adhesive can be prevented.

In the deposition mask of the present invention, the surfaces of the one or more mask chips have thin films consisting of carbon and fluorine.

Since the surfaces of the one or more mask chips have thin films consisting of carbon and fluorine, the deposition mask can be readily detached from a deposition substrate in a deposition step.

A method for manufacturing a deposition mask, according to the present invention, having a configuration in which one or more mask chips each including a single crystal silicon substrate are joined to a mask support includes a step of joining the single crystal silicon substrate of each mask chip to a predetermined section of the mask support in such a manner that the crystal orientation of the single crystal silicon substrate is aligned in a predetermined direction, and a step of forming openings in the single crystal silicon substrates joined to the mask support to prepare the one or more mask chips, the forming step being performed after the joining step is performed.

Since the single crystal silicon substrate is joined to the mask support made of borosilicate glass and the openings according to a pixel pattern are then formed in the resulting single crystal silicon substrates, the positional accuracy need not be high when each single crystal silicon substrate is joined to the mask support; hence, the deposition mask can be easily manufactured. Furthermore, since the openings are formed after the single crystal silicon substrates are joined to the mask support, the openings are fit for a fine pixel pattern. If a plurality of the single crystal silicon substrates are joined to the mask support, the obtained deposition mask is useful in treating a large-sized deposition substrate by a vapor deposition process; hence, a large number of electroluminescent display units can be manufactured at a time.

In the method for manufacturing a deposition mask according to the present invention, the step of joining the single crystal silicon substrate of each mask chip to the predetermined section of the mask support in such a manner that the crystal orientation of the single crystal silicon substrate is aligned in the predetermined direction includes a sub-step of aligning the crystal orientation of the single crystal silicon substrate in the predetermined direction using a reference member having at least one straight side.

In the step of joining the single crystal silicon substrate to the mask support, the crystal orientation of the single crystal silicon substrate is aligned in the predetermined direction using the reference member having at least one straight side; hence, the single crystal silicon substrates arranged in a line can be joined to the mask support in one step. The crystal orientations of the single crystal silicon substrates can be precisely aligned with each other by the use of the reference member.

The method for manufacturing a deposition mask according to the present invention further includes a step of forming an etching mask on the single crystal silicon substrate, the etching mask-forming step being performed before performing the step of joining the single crystal silicon substrate to the predetermined section of the mask support in such a manner that the crystal orientation of the single crystal silicon substrate is aligned in the predetermined direction.

Since the etching mask is formed on the single crystal silicon substrate before the single crystal silicon substrate is joined to the mask support, flexure due to heat oxidation or the like can be prevented from occurring in the mask support made of borosilicate glass or the like.

In the method for manufacturing a deposition mask according to the present invention, the single crystal silicon substrate is joined to the mask support by anodic coupling if the mask support is made of borosilicate glass.

Since the single crystal silicon substrate is joined to the mask support made of borosilicate glass by anodic coupling, an adhesive is not necessary and flexure due to such an adhesive can be prevented.

In the method for manufacturing a deposition mask according to the present invention, the single crystal silicon substrate is prepared by dividing a single crystal silicon wafer using cleavage.

Since the single crystal silicon substrate is prepared by dividing the single crystal silicon wafer using cleavage, the crystal orientations of the obtained single crystal silicon substrates are aligned with each other.

In the method for manufacturing a deposition mask according to the present invention, thin films consisting of carbon and fluorine are formed on surfaces of the one or more mask chips in a plasma atmosphere of a mixture of carbon and fluorine.

Since the thin films consisting carbon and fluorine are formed on the one or more mask chips, the deposition mask obtained by this method can be readily detached from a deposition substrate in a deposition step.

An electroluminescent display unit according to the present invention includes a hole-injection layer, a light-emitting layer, and an electron-transport layer formed by using the deposition mask described above.

Since the deposition mask has the openings fit for a fine pixel pattern, an electroluminescent layer including the hole-injection layer, light-emitting layer, and electron-transport layer formed by using the deposition mask are fine; hence, an electroluminescent display unit including such an electroluminescent layer has high definition.

An electroluminescent display unit according to the present invention has an electron-injection layer, a light-emitting layer, and a hole-transport layer formed using the deposition mask described above.

Since the deposition mask has the openings fit for a fine pixel pattern, an electroluminescent layer including the electron-injection layer, light-emitting layer, and hole-transport layer formed using the deposition mask is fine; hence, an electroluminescent display unit including such electroluminescent layer has high definition.

A method for manufacturing electroluminescent display units according to the present invention includes a step of placing the deposition mask described above at a predetermined section of a deposition substrate to be treated by a vapor deposition process, so as to form hole-injection layers, light-emitting layers, and electron-transport layers.

A large number of electroluminescent display units can be manufactured at a time using the deposition mask and high-definition electroluminescent display units can be obtained.

A method for manufacturing electroluminescent display units according to the present invention includes a step of placing the deposition mask described above at a predetermined section of a deposition substrate to be treated by a vapor deposition process, so as to form electron-injection layers, light-emitting layers, and hole-transport layers.

A large number of electroluminescent display units can be manufactured at a time using the deposition mask and high-definition electroluminescent display units can be obtained.

An electronic apparatus according to the present invention includes an electroluminescent display unit having a hole-transport layer, a light-emitting layer, and the like formed using the deposition mask described above.

Since the electroluminescent layer including the hole-injection layer and light-emitting layer formed using the deposition mask is fine, an electroluminescent display unit including such an electroluminescent layer has high definition.

DESCRIPTION OF THE PREFERRED EMBODIMENTS

First Embodiment

Figure 1A:
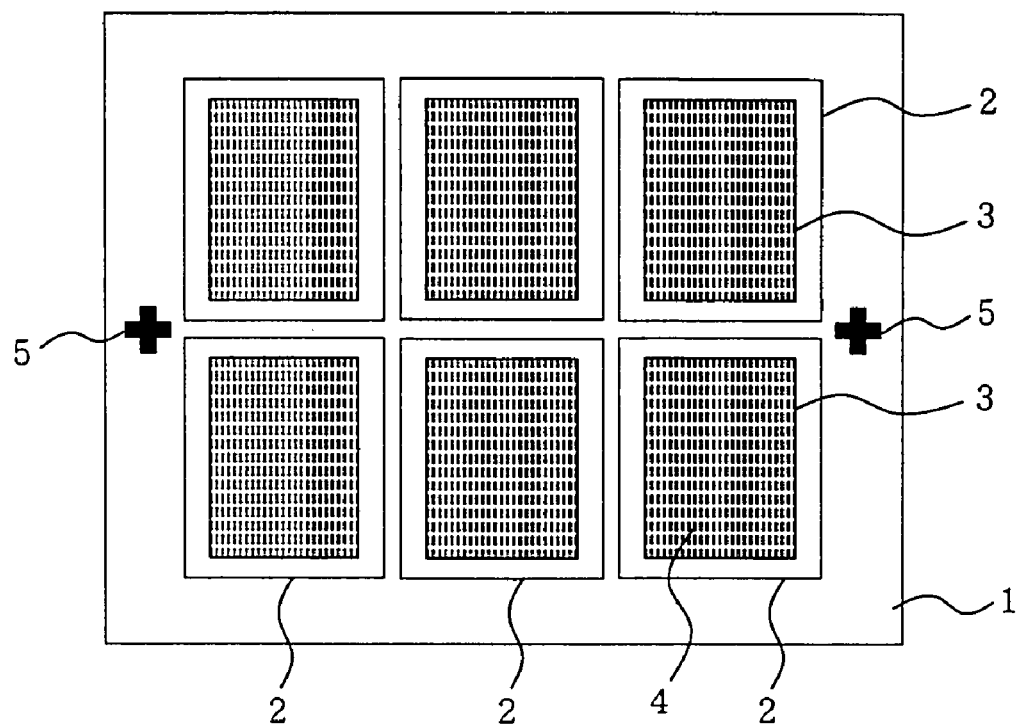
FIG. 1(A) is a top view showing a deposition mask according to a first embodiment of the present invention.
Figure 1B:
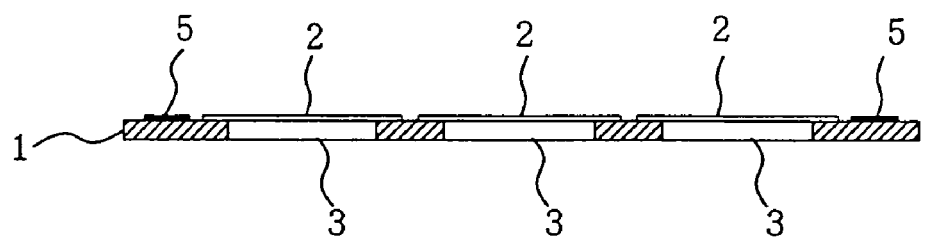
FIG. 1(B) is a cross sectional view of the deposition mask.

FIG. 1 is an illustration showing a deposition mask according to a first embodiment of the present invention. FIG. 1(A) is a top view showing the deposition mask and FIG. 1(B) is a transverse sectional view showing the deposition mask. The deposition mask of the first embodiment has a configuration in which a plurality of mask chips 2 each including a single crystal silicon substrate are arranged on the upper face of a mask support 1 made of borosilicate glass, the number of the mask chips 2 being six in FIG. 1(a). The mask support 1 has a plurality of apertures 3 and the mask chips 2 are joined to the mask support 1 in such a manner that the mask chips 2 respectively cover the corresponding apertures 3. Each of the mask chip 2 has a large number of openings 4 corresponding to pixels. The openings 4 have a size of several ten-μm square and all single-color pixels are formed in one step when a deposition substrate is treated by a vapor deposition process. A method for forming electroluminescent layers by the vapor deposition process is described later in detail. The mask support 1 has convex alignment marks 5 used for aligning the mask support 1 with the deposition substrate (of positions and directions). The alignment marks 5 may be recessions or perforations.

In the first embodiment, the mask support 1 is made of borosilicate glass; however, the mask support 1 may be formed of a silicon substrate. Furthermore, a single mask chip may be joined to mask support 1 instead of a plurality of the mask chips 2.

Figure 2:
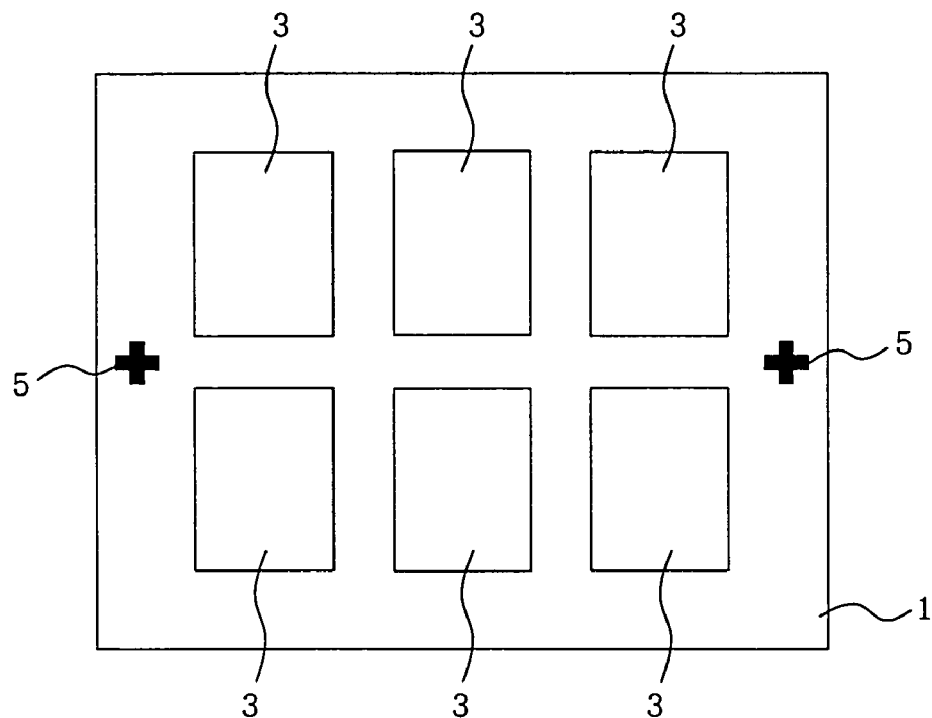
FIG. 2 is an illustration showing a mask support included in the deposition mask shown in FIG. 1.
Figure 3:
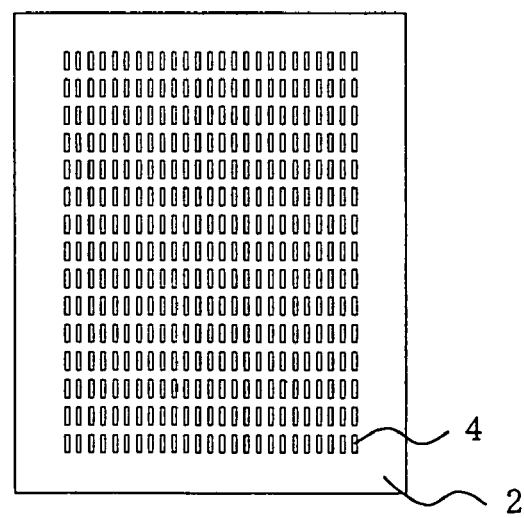
FIG. 3 is an illustration showing one of mask chips of the deposition mask shown in FIG. 1.

FIG. 2 is an illustration showing the mask support 1 of the deposition mask shown in FIG. 1, and FIG. 3 is an illustration showing one of the mask chips 2 of the deposition mask shown in FIG. 1. With reference to FIG. 2, the mask support 1 has a plurality of the apertures 3 and the alignment marks 5 are placed on the upper face thereof. The apertures 3 are formed, for example, by directing a jet of fine abrasive grains toward a borosilicate glass substrate. The alignment marks 5 may be formed according to the following procedure: a gold or chromium layer is formed on the borosilicate glass substrate by a sputtering process and the resulting substrate is patterned by a photolithographic process and then etched. With reference to FIG. 3, the mask chips 2 each have a large number of the openings 4. The mask chips 2 are joined to the mask support 1 such that the openings 4 are positioned above the apertures 3.

The mask support 1 is preferably prepared using a material having a thermal expansion coefficient close or equal to that of silicon. This is because heat strain can be prevented from being applied to joints between the mask support 1 and the mask chips 2 when an electroluminescent layer is formed by the vapor deposition process. For example, borosilicate glass Pyrex™ #7744 (manufactured by Corning Inc.) has a thermal expansion coefficient of $3.25 \times 10^{-6}/°$ C. and silicon has a thermal expansion coefficient of $3.5 \times 10^{-6}/°$ C., that is, the thermal expansion coefficient of the glass is very close to that of silicon; hence, the glass is fit to prepare the mask support 1.

Figure 4:
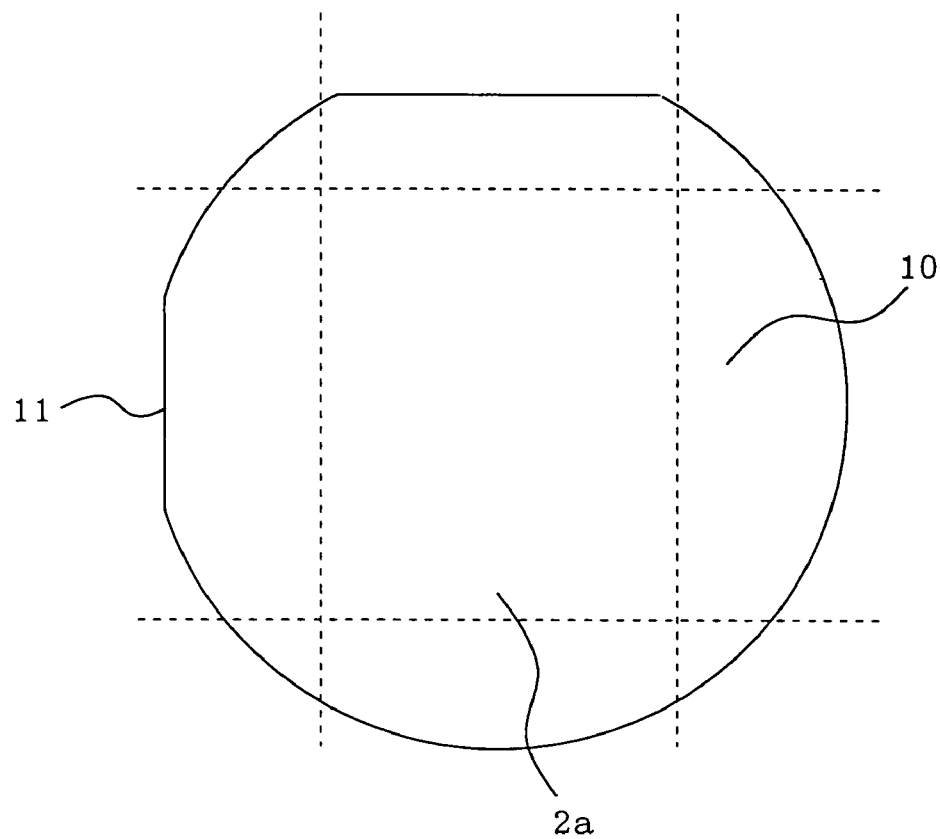
FIG. 4 is an illustration showing a step of preparing single crystal silicon substrates by a cutting process.

FIG. 4 is an illustration showing a step of dividing a single crystal silicon wafer into single crystal silicon substrates for preparing the mask chips 2. The following wafer is prepared: a single crystal silicon wafer 10 having a surface of, for example, a <100> crystal orientation and having two orientation flats 11 (hereinafter referred to as ori-flas). The single crystal silicon wafer 10 has the <100> crystal orientation and the ori-flas 11 perpendicularly crossing each other in a <100> crystal plane. The single crystal silicon wafer 10 is covered with a silicon dioxide layer, formed by thermal oxidation in advance, for forming an etching mask. The single crystal silicon wafer 10 is cut along lines parallel to the ori-flas 11 with a dicing saw, whereby the single crystal silicon substrates 2a having a rectangular shape are obtained. Alternatively, the single crystal silicon wafer 10 may be cloven into the single crystal silicon substrates 2a without using the dicing saw. In order to cleave the single crystal silicon wafer 10, narrow grooves are preferably formed along dividing lines in advance. The single crystal silicon substrates 2a need not be rectangular if the single crystal silicon substrates 2a each have at least one straight side. Silicon dioxide layers may be formed on the respective single crystal silicon substrates 2a after cutting the wafer, or silicon nitride layers or the like may be formed thereon with a CVD (Chemical Vapor Deposition) system.

Figure 5:
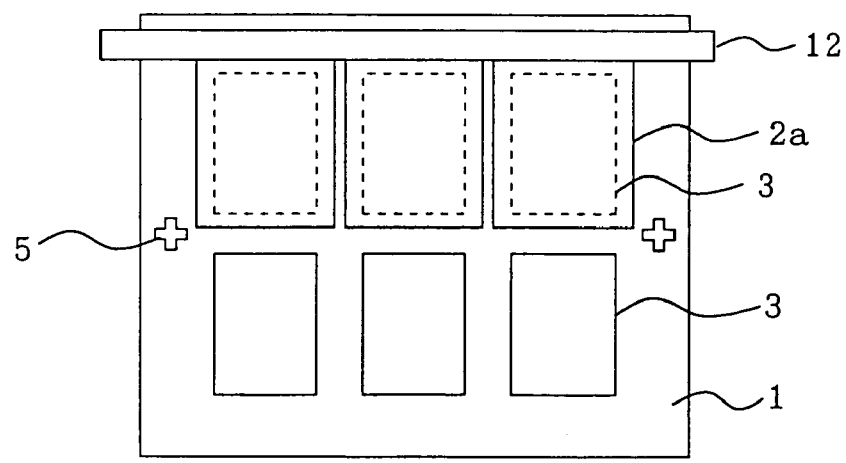
FIG. 5 is a top view showing a step of joining the single crystal silicon substrates to the mask support.

FIG. 5 is a top view showing a step of joining the single crystal silicon substrates 2a made by the process shown in FIG. 4 to the mask support 1. In the step of joining the single crystal silicon substrates 2a, the single crystal silicon substrates 2a do not yet have the openings 4 corresponding to pixels. In the step shown in FIG. 5, the mask chips 2 are joined to the upper face of the mask support 1 provided with the apertures 3 and the alignment marks 5. In this step, the crystal orientations of the single crystal silicon substrates 2a are aligned with each other using a reference member 12 having at least one straight side. In order to align the crystal orientations, the directions of the alignment marks 5 and the reference member 12 are relatively aligned and sides of the single crystal silicon substrates 2a obtained by the process shown in FIG. 4 are aligned by placing them along the reference member (see FIG. 5). According to this operation, the single crystal silicon substrates 2a arranged in a line as shown in FIG. 5 can be joined to the mask support 1 in one step using the reference member 12. The alignment is herein performed for each line using the reference member 12. In the first embodiment, the single crystal silicon substrates 2a are joined to the mask support 1 with a UV-curable adhesive. Since the openings 4 corresponding to pixels are formed after the single crystal silicon substrates 2a are joined to the mask support 1 as described below, the accuracy of the positions of the single crystal silicon substrates 2a need not be so high.

Figure 6:
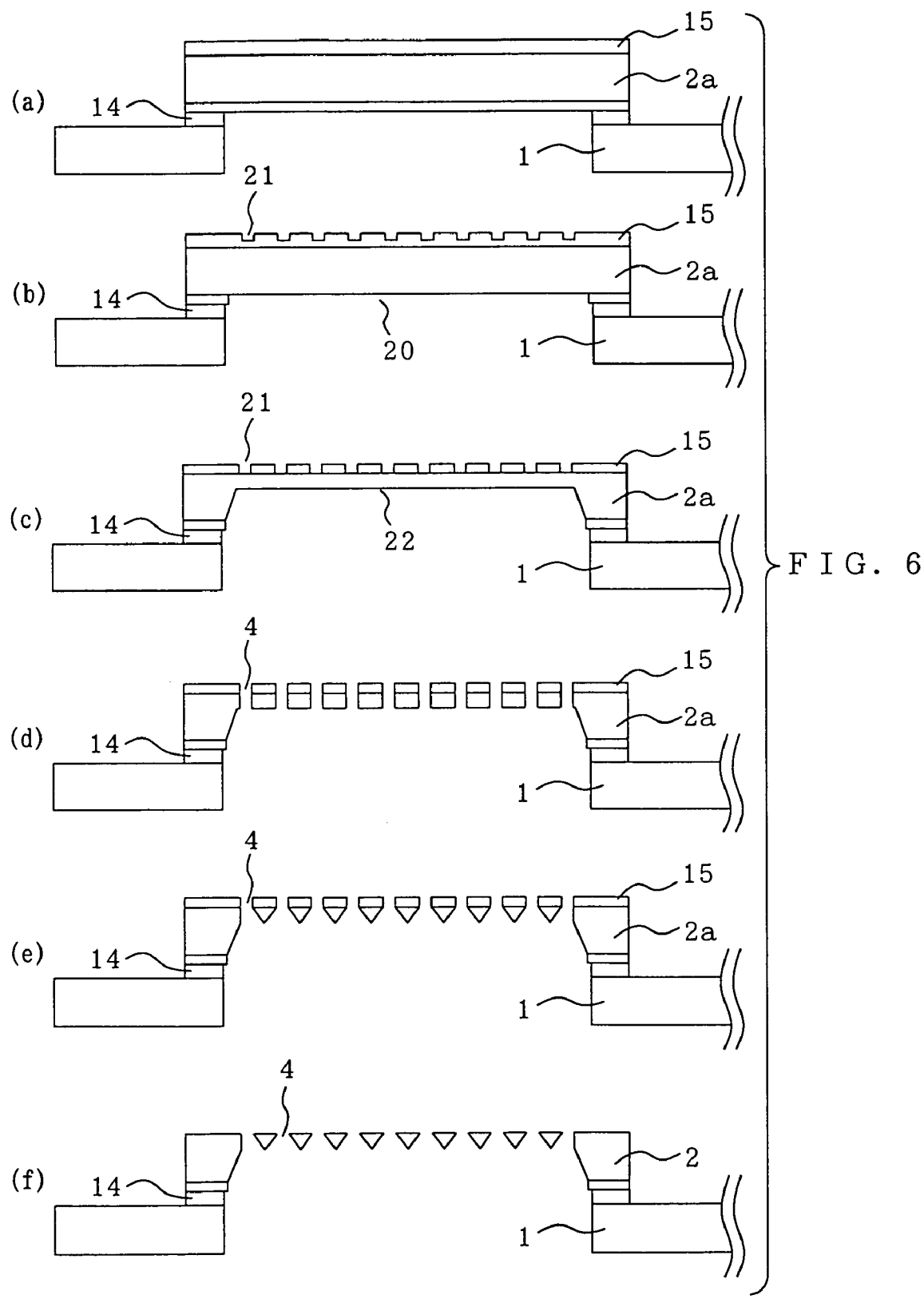
FIG. 6 is an enlarged sectional view showing a step of preparing the deposition mask.

FIG. 6 is an enlarged sectional view showing a step of processing the mask support 1 having the single crystal silicon substrates 2a preliminarily joined in the step shown in FIG. 5, to prepare the deposition mask. FIG. 6 shows one of the single crystal silicon substrates 2a and regions of the mask support 1 surrounding the substrate. First of all, the mask support 1 having the single crystal silicon substrates 2a joined in the step shown in FIG. 5 is prepared (FIG. 6(a)). Here, silicon dioxide layers 15 are placed on both surfaces of each single crystal silicon substrate 2a, and the single crystal silicon substrate 2a is joined to the mask support 1 with the UV-curable adhesive 14. Subsequently, a silicon dioxide layer 20 placed on the lower face of the single crystal silicon substrate 2a is removed, and the silicon dioxide layer 15 placed on the upper face of the single crystal silicon substrate 2a is patterned by a photolithographic process, whereby a pattern corresponding to a pixel pattern (the openings 4) is formed. The resulting silicon dioxide layer 15 is then half-etched using hydrofluoric acid, whereby patterned portions 21 are formed (FIG. 6(b)). Here, the silicon dioxide layer 20 placed on the lower face of the single crystal silicon substrate 2a is photolithographically processed and then dry-etched using $CF_3$ gas, whereby the silicon dioxide layer 20 is selectively removed.

The mask support 1 having each single crystal silicon substrate 2a is immersed in an aqueous TMAH (tetramethyl hydroxide) solution, whereby the lower faces of the single crystal silicon substrate 2a is isotropically etched, thereby forming a recessed section 22. The resulting mask support 1 having the single crystal silicon substrate 2a is then immersed in an aqueous hydrofluoric acid solution, whereby the silicon dioxide layer 15 placed on the upper face of the single crystal silicon substrate 2a is etched until portions of the silicon dioxide layers 15 under the patterned portions 21 are entirely removed (FIG. 6(c)).

Regions under the patterned portions 21 are then irradiated with YAG laser light, whereby the openings 4 are formed (FIG. 6(d)). Here, the silicon dioxide layer 15 functions as a deposition mask; hence, only silicon portions are etched, whereby the openings 4 are formed in the single crystal silicon substrate 2a.

The mask support 1 having the single crystal silicon substrates 2a is then immersed in an aqueous potassium hydroxide solution, whereby the single crystal silicon substrates 2a are anisotropically etched (FIG. 6(e)). According to this operation, silicon regions surrounding the openings 4 of the single crystal silicon substrate 2a are etched and therefore tapered off. This is because an evaporated material is allowed to pass through the openings 4 in various directions in a deposition step.

Finally, the silicon dioxide layer 15 placed on the upper face of the single crystal silicon substrate 2a is removed by a dry etching process using the $CF_3$ gas, whereby the deposition mask is completed (FIG. 6(f)).

Incidentally, the silicon dioxide layers 15 may be removed using a diluted aqueous hydrofluoric acid solution, in the step shown in FIG. 6(f).

The deposition mask is completed in the step shown in FIG. 6(f). A thin film consisting of carbon and fluorine may be formed on the upper face of the obtained deposition mask. This film is referred to as a so-called Teflon™ film. The deposition mask having the film can be readily detached from the deposition substrate in the vapor deposition step. In order to form the thin film consisting of carbon and fluorine, the deposition mask is treated in a plasma atmosphere containing a mixture of carbon and fluorine, thereby forming the thin film to cover the deposition mask.

In the first embodiment, since the single crystal silicon substrates 2a are joined to the mask support 1 made of borosilicate glass and the openings 4 corresponding to a pixel pattern are then formed, the accuracy of the positions of the single crystal silicon substrates 2a joined to the mask support 1 need not be high; hence, the deposition mask can be easily prepared. Furthermore, since the openings 4 are formed after the single crystal silicon substrates 2a are joined to the mask support 1, the openings are fit to form the fine pixel pattern. Since a plurality of the single crystal silicon substrates are joined to the mask support, a large-sized deposition substrate can be treated by a vapor deposition process; hence, a large number of electroluminescent display units can be manufactured at a time.

In the step of joining the single crystal silicon substrates 2a to the mask support 1, the crystal orientations of the single crystal silicon substrates 2a are aligned with each other using the reference member 12 having at least one straight side; hence, the single crystal silicon substrates 2a arranged in a line can be joined to the mask support 1 in one step. Furthermore, the crystal orientations of the single crystal silicon substrates 2a can be precisely aligned with each other by the use of the reference member 12.

Second Embodiment

Figure 7:
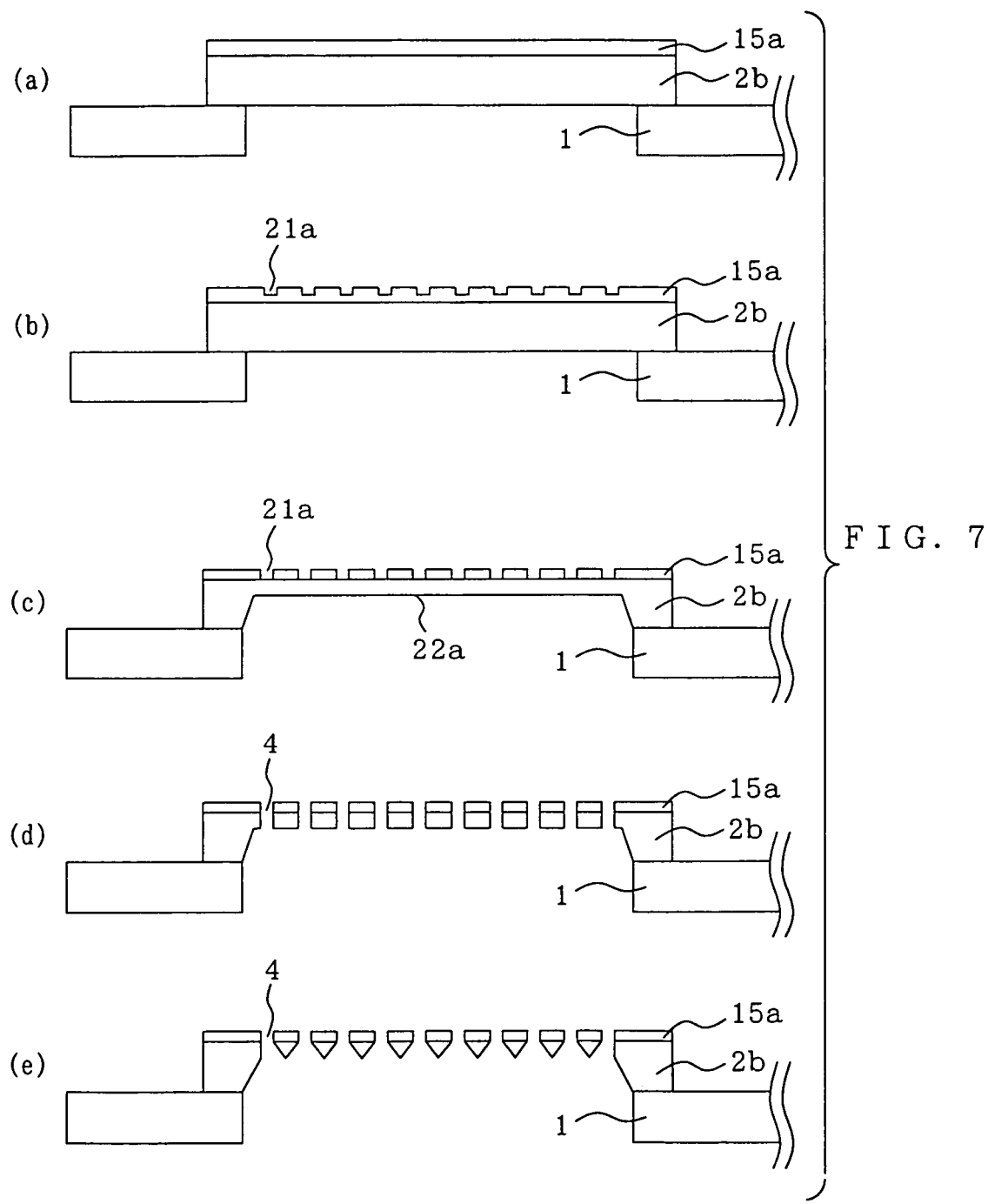
FIG. 7 is an enlarged sectional view showing steps of manufacturing a deposition mask according to a second embodiment.

FIG. 7 is an enlarged sectional view showing steps of manufacturing a deposition mask according to a second embodiment of the present invention. FIG. 7 shows one of single crystal silicon substrates 2b and regions of a mask support surrounding the substrate. The deposition mask of the second embodiment has substantially the same configuration as that of the deposition mask of the first embodiment shown in FIG. 1 unless otherwise specified, and the same components as those of the deposition mask of the first embodiment shall have the same reference numerals.

A gold-chromium layer 15a is formed by a sputtering process on the upper face of a single crystal silicon wafer 10, as shown in FIG. 4, having a <100> crystal orientation. In this operation, a chromium sub-layer having affinity for silicon is preferably formed primarily and a gold sub-layer having high chemical resistance is then formed thereon. The resulting single crystal silicon wafer 10 is cut into single crystal silicon substrates 2b and the single crystal silicon substrates 2b are then joined to the mask support 1 made of borosilicate glass by anodic coupling in the same manner as that described in the first embodiment (FIG. 7(a)). In the anodic coupling, the single crystal silicon substrates 2b and the mask support 1 are first arranged so that the surfaces of the substrates meet the surface of the mask support 1, the crystal orientations of the substrates are subsequently aligned with each other in the same manner as that described in the first embodiment, the resulting single crystal silicon substrates 2b and mask support 1 are heated to 300° C. to 500° C., and a voltage of about 500 V is then applied to them.

The gold-chromium layer 15a of each substrate is then patterned, whereby a pattern corresponding to a pixel pattern (openings 4) is formed. The resulting layer is half-etched using an etching solution for gold and chromium, whereby patterned portions 21a are formed (FIG. 7(b)).

The lower face of each single crystal silicon substrates 2b is anisotropically etched using an aqueous TMAH solution, whereby recessed sections 22a are formed. The resulting mask support 1 having the single crystal silicon substrate 2b is then immersed in the etching solution for gold and chromium, whereby the gold-chromium layer 15a is etched until the patterned portions 21a of the gold-chromium layer are entirely removed (FIG. 7(c)).

The openings 4 are formed in the single crystal silicon substrate 2b by the application of YAG laser light in the same manner as that described in the first embodiment (FIG. 7(d)). Finally, the mask support 1 having the single crystal silicon substrate 2b is etched using an aqueous potassium hydroxide solution, whereby silicon regions surrounding the openings 4 of the single crystal silicon substrate 2b are tapered off, thereby obtaining the deposition mask (FIG. 7(e)).

The gold-chromium layer 15a remaining in the step shown in FIG. 7(e) may be removed by an etching process.

In the second embodiment, since the single crystal silicon substrates 2b are joined to the mask support 1 made of borosilicate glass by anodic coupling, an adhesive is not necessary and flexure due to such an adhesive can be prevented from occurring. Furthermore, since no adhesive is used, no gases are formed in a vapor deposition step; hence, the deposition mask fit for high-vacuum deposition can be manufactured.

Third Embodiment

Figure 8:
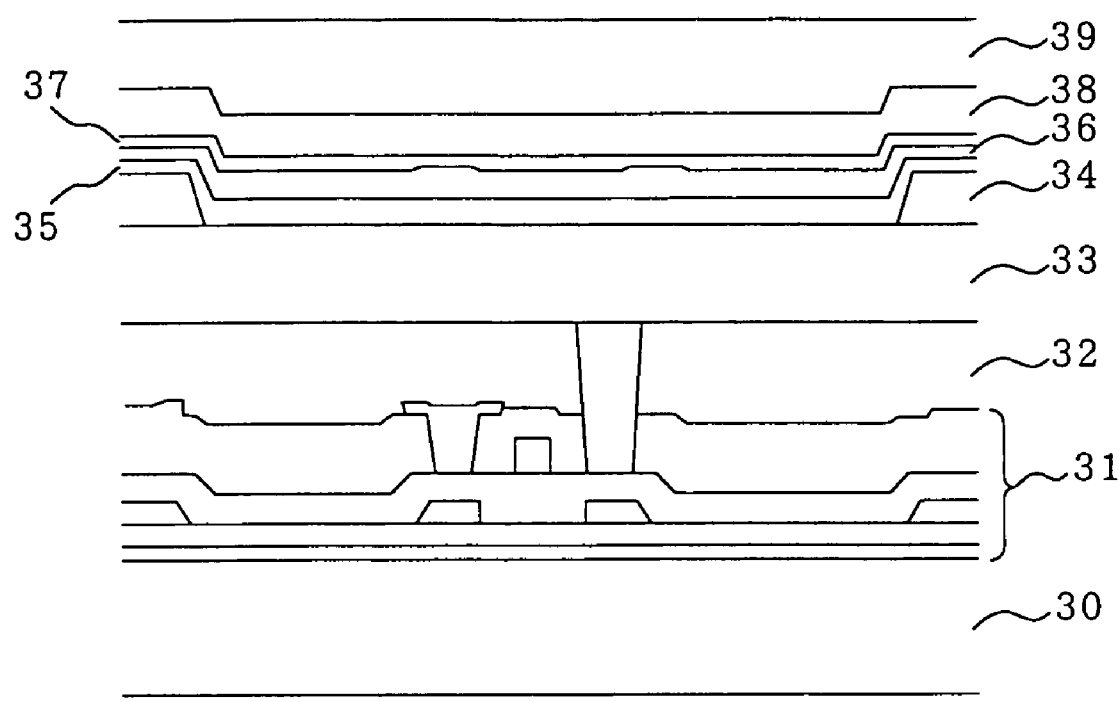
FIG. 8 is a vertical sectional view showing one of pixels included in an electroluminescent display unit.

FIG. 8 is a vertical sectional view showing one of pixels included in an electroluminescent display unit according to a third embodiment of the present invention. In the third embodiment, an organic EL display unit is described as an example of the electroluminescent display unit.

The organic EL display unit shown in FIG. 8 includes a glass substrate 30 made of alkali-free glass, TFT wiring lines 31, a planarizing insulating layer 32, and an ITO layer 33 disposed in that order. ITO (Indium Tin Oxide) functions as an anode for applying currents to the pixel. Silicon dioxide layer 34 is placed at regions, emitting no light, surrounding the pixel. A hole-transport layer 35, a light-emitting layer 36, and an electron-injection layer 37, which constitute an electroluminescent layer, are made of organic EL materials and formed by a vapor deposition process or the like. ITO layers 38 functioning as cathodes and a transparent sealing film 39 are disposed on these layers. The deposition mask described in the first or second embodiment is principally used for forming the electroluminescent layer, but it may be used as a sputter mask for forming the ITO layer 33 by a sputtering process. Incidentally, the electroluminescent layer may include a hole-injection layer or the like if it is provided in addition to the hole-transport layer 35, the light-emitting layer 36, and the electron-injection layer 37. Alternatively, an electron-transport layer, a light-emitting layer, and hole-injection layer functioning as an electroluminescent layer may be formed instead of the hole-transport layer 35, the light-emitting layer 36, and the electron-injection layer 37.

Figure 9:
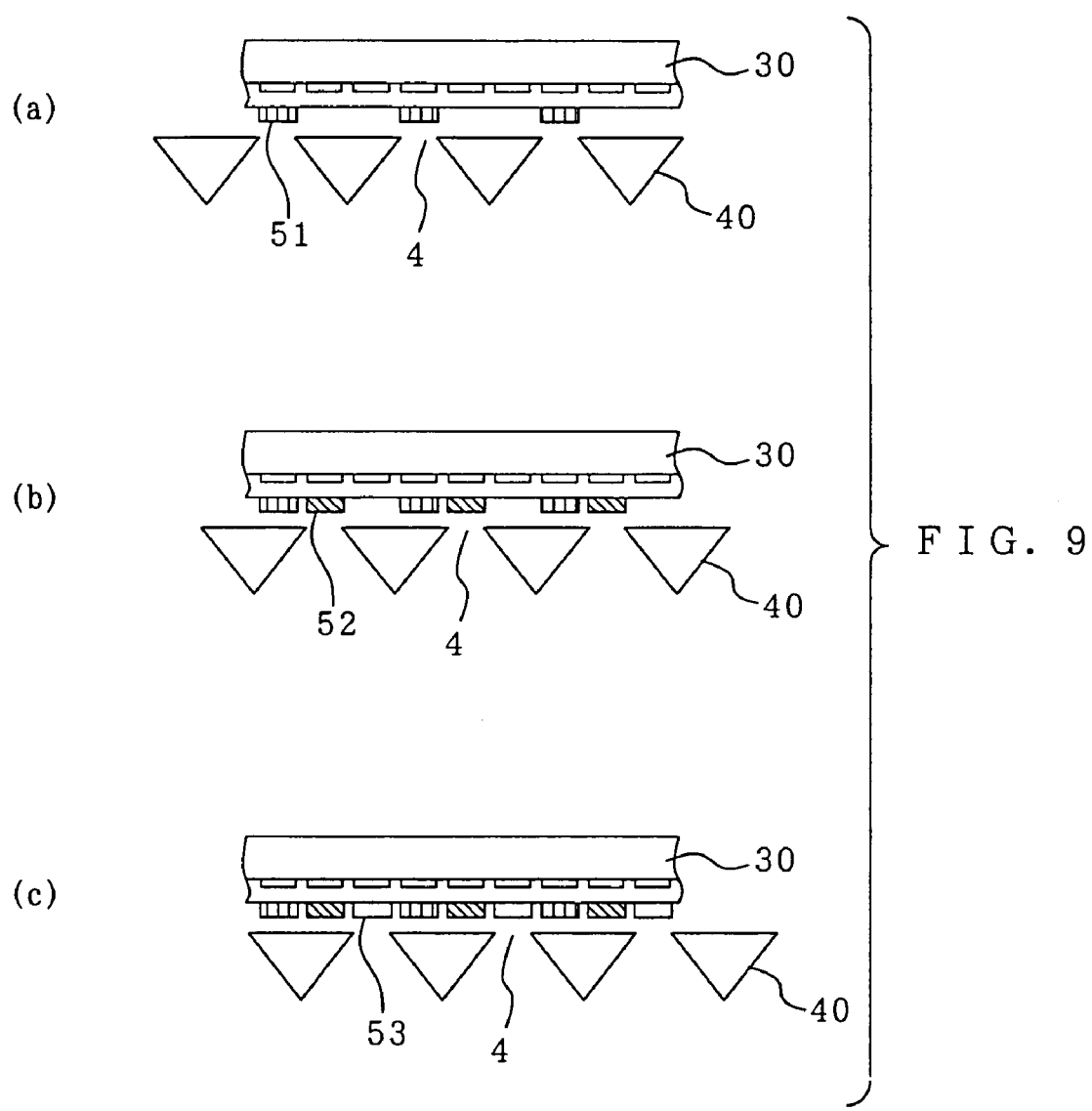
FIG. 9 is a fragmentary sectional view showing steps of forming electroluminescent layers.

FIG. 9 is a fragmentary sectional view showing steps of forming the electroluminescent layer using the deposition mask described in the first or second embodiment. Openings 4 of a deposition mask 40 (FIG. 9 shows periphery of the openings 4 only) are arranged to meet portions for red pixels on a glass substrate 30 having an ITO layer 33 and the like, and a red electroluminescent layer 51 for the red pixels are formed by a vapor deposition process (FIG. 9(a)). The deposition mask 40 is then moved so that the openings 4 are arranged to meet portions for green pixels on the glass substrate 30, and a green electroluminescent layer 52 for the green pixels are then formed by the vapor deposition process (FIG. 9(b)). According to the same procedure as the above, a blue electroluminescent layer 53 for blue pixels are formed by the vapor deposition process (FIG. 9(c)).

In the third embodiment, since the electroluminescent layer is formed using the deposition mask described in the first or second embodiment, a high-definition electroluminescent display unit including the fine electroluminescent layer can be manufactured.

Fourth Embodiment

Figure 10:
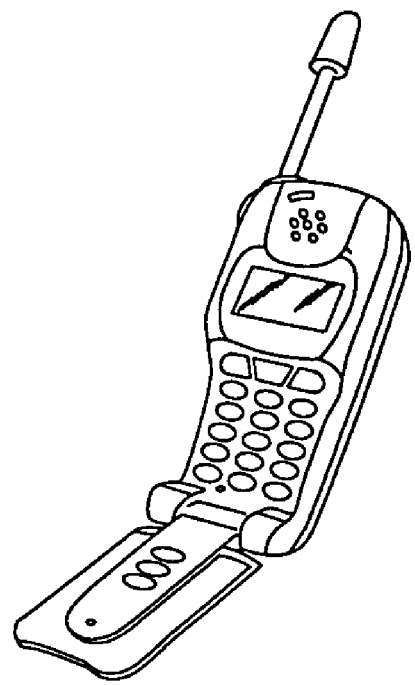
FIGS. 10(A) and 10(B) are illustrations showing examples of an electronic apparatus according to a fourth embodiment of the present invention.
Figure 10:
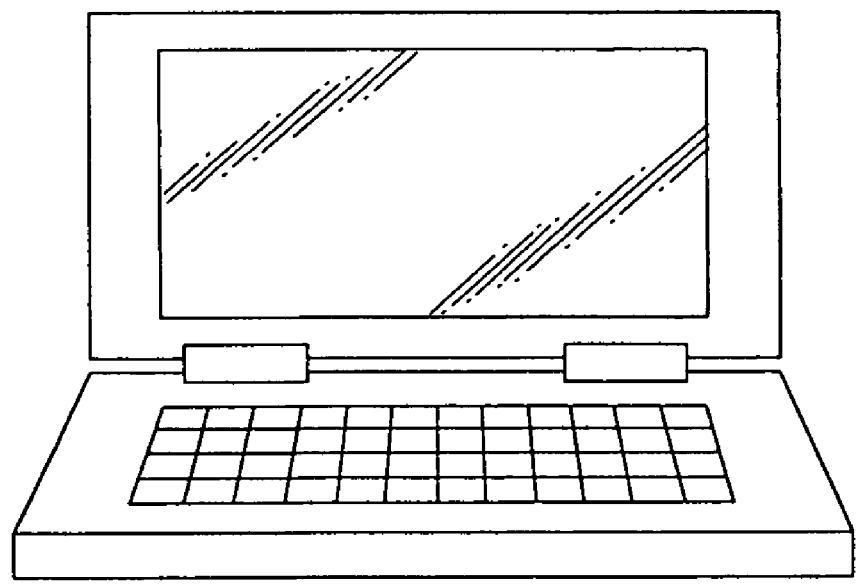

FIG. 10 is an illustration showing an example of an electronic apparatus according to a fourth embodiment of the present invention. FIG. 10(A) shows a mobile phone including a display panel, which is an example of an electroluminescent display unit of the present invention. FIG. 10(B) shows a personal computer including the electroluminescent display unit of the present invention. The electroluminescent display unit of the present invention can be used for a display panel for a game machine or a digital camera.

The entire disclosure of Japanese patent application No. 2003-200064 filed Jul. 22, 2003 is hereby incorporated by reference.

What is claimed is:

1. A deposition mask comprising:
    a configuration in which one or more mask chips each including a single crystal silicon substrate are joined to a mask support,
    wherein the one or more mask chips are joined to respective predetermined sections of the mask support,
    the orientations of the one or more mask chips are arranged in such a manner that the crystal orientation of the single crystal silicon substrate is aligned in a predetermined direction, and
    the single crystal silicon substrate of each mask chip has openings;
    wherein the mask support is made of borosilicate glass and the single crystal silicon substrate is joined to the mask support by anodic coupling.

2. The deposition mask according to claim 1, wherein an etching mask is formed on the single crystal silicon substrate before the one or more mask chips are joined to the respective predetermined sections of the mask support in such a manner that the crystal orientation of the single crystal silicon substrate is aligned in the predetermined direction.

3. The deposition mask according to claim 1, wherein the surfaces of the one or more mask chips have thin films consisting of carbon and fluorine.

4. A method for manufacturing a deposition mask comprising a configuration in which one or more mask chips each including a single crystal silicon substrate are joined to a mask support, comprising:
    a step of joining the single crystal silicon substrate of each mask chip to a predetermined section of the mask support in such a manner that the crystal orientation of the single crystal silicon substrate is aligned in a predetermined direction and a step of forming openings in the single crystal silicon substrate joined to the mask support to prepare the one or more mask chips, the forming step being performed after the joining step;

wherein the step of joining the single crystal silicon substrate of each mask chip to the predetermined section of the mask support in such a manner that the crystal orientation of the single crystal silicon substrate is aligned in the predetermined direction includes a sub-step of aligning the crystal orientation of the single crystal silicon substrate in the predetermined direction using a reference member having at least one straight side.

5. The method for manufacturing a deposition mask according to claim 4, further comprising a step of forming an deposition mask on the single crystal silicon substrate, the etching mask-forming step being performed before performing the step of joining the single crystal silicon substrate to the predetermined section of the mask support in such a manner that the crystal orientation of the single crystal silicon substrate is aligned in the predetermined direction.

6. The method for manufacturing a deposition mask according to claim 4, wherein the single crystal silicon substrate is joined to the mask support by anodic coupling if the mask support is made of borosilicate glass.

7. The method for manufacturing a deposition mask according to claim 4, wherein the single crystal silicon substrate is prepared by dividing a single crystal silicon wafer using cleavage.

8. The method for manufacturing a deposition mask according to claim 4, wherein thin films consisting of carbon and fluorine are formed on surfaces of the one or more mask chips, in a plasma atmosphere of a mixture of carbon and fluorine.

9. An electroluminescent display unit having a hole-injection layer, a light-emitting layer and an electron-transport layer which are formed using the deposition mask according to claim 1.

10. An electroluminescent display unit having an electron-injection layer, a light-emitting layer and a hole-transport layers which are formed using the deposition mask according to claim 1.

11. A method for manufacturing electroluminescent display units, comprising a step of placing the deposition mask according to claim 1 at a predetermined section of a deposition substrate to be treated by a vapor deposition process, so as to form hole-injection layers, light-emitting layers, and electron-transport layers.

12. A method for manufacturing electroluminescent display units, comprising a step of placing the deposition mask according to claim 1 at a predetermined section of a deposition substrate to be treated by a vapor deposition process, so as to form electron-injection layers, light-emitting layers, and hole-transport layers.

13. An electronic apparatus comprising the electroluminescent display unit according to claim 9.

14. An electronic apparatus comprising the electroluminescent display unit according to claim 10.

* * * * *